United States Patent [19]

Beha et al.

[11] Patent Number: 4,525,730
[45] Date of Patent: Jun. 25, 1985

[54] BURIED JUNCTION JOSEPHSON INTERFEROMETER

[75] Inventors: Johannes G. Beha, Wadenswil; Heinz Jaeckel, Kilchberg; Peter Vettiger, Langnau A. Albis, all of Switzerland

[73] Assignee: International Business Machines Corporation, Armonk, N.Y.

[21] Appl. No.: 445,331

[22] Filed: Nov. 29, 1982

[51] Int. Cl.³ .................... H01L 39/22; H01L 27/12; H01L 45/00; H01L 45/02
[52] U.S. Cl. ............................................ 357/5; 357/4
[58] Field of Search ...................... 357/5, 4

[56] References Cited

U.S. PATENT DOCUMENTS

| | | | |
|---|---|---|---|
| 3,936,809 | 2/1976 | Zappe | 340/173.1 |
| 4,028,714 | 6/1977 | Henkels | 357/5 |
| 4,263,603 | 4/1981 | Jillie, Jr. | 357/5 |

OTHER PUBLICATIONS

H. Beha "Asymmetric 2-Josephson-Junction Interferometer as a Logic Gate," *Electronics Letters,* Mar. 31, 1977, vol. 13, No. 7, pp. 218–220.
H. Beha et al., "High Tolerance 3-Josephson Junction Current-Injection Logic Devices", *Digest of IEEE Intermag Conference* 1981, Grenoble, 5/81, pp. 40–44.
L. M. Geppert et al., "Damped Three-Junction-Interferometers for Latching Logic," *IEEE Transactions on Magnetics,* vol. Mag-15, No. 1, Jan. 1978, pp. 412–415.
T. O. Mohr et al., "Fabrication of Compact Josephson Edge Junction Interferometer," *IBM Technical Disclosure Bulletin,* vol. 23, No. 12, May 1981, pp. 5574–5575.
C. C. Chi et al., "Amorphous-Crystalline-Amorphous Josephson Weak-Link Devices," *IBM Technical Disclosure Bulletin,* vol. 23, No. 7B, Dec. 1980, pp. 3415–3417.
W. H. Henkels, "Compact Bridge Josephson Interferometer," *IBM Technical Discl. Bulletin,* vol. 22, No. 7, Dec. 1979, pp. 2970–2973.
S. M. Faris, "Coupling Element for Josephson Read-Only Memory," *IBM Technical Discl. Bulletin,* vol. 20, No. 10, Mar. 1978, pp. 4197–4198.
P. Guéret et al., "Single Flux-Quantum Memory Cells", *IEEE Trans. on Magnetics,* vol. Mag-13, No. 1, Jan. 1977, pp. 52–55.
T. R. Gheewala et al., "New Interferometer Structures," *IBM Technical Discl. Bulletin,* vol. 22, No. 5, Oct. 1979, pp. 2139–2142.
T. R. Gheewala, "Design of 2.5-Micrometer Josephson Current Injection Logic (CIL)", *IBM J. Res. Develop.,* vol. 24, No. 2, Mar. 1980, pp. 130–142.
H. Beha, "Two-Josephson-Junction Interferometer Memory Cell For N.D.R.O." *Electronics Letter,* Sep. 29, 1977, vol. 13, No. 20, pp. 596–598.

*Primary Examiner*—Martin H. Edlow
*Assistant Examiner*—Eric Fallick
*Attorney, Agent, or Firm*—Carl C. Kling

[57] ABSTRACT

Planar junction Josephson interferometer in which the junctions (24) are "buried" underneath the interferometer bridge (27) connecting the junction counter-electrodes (25). The insulation (26) that separates the common base electrode (22) from the bridge (27) is extended between the bridge and the upper surfaces of the counter-electrodes. This design permits, without decreasing the interferometer loop inductance, a reduction of the interferometer area and thus results in a higher packaging density in logic or memory applications.

The buried junction concept can be applied in symmetric or asymmetric interferometer designs with virtually any number of junctions, any type of input current control or current feeding scheme.

The interferometer can be produced using conventional evaporation, photo-resist, and etch processes based on optical lithography. Further area reduction is achieved in applying e-beam or x-ray technology.

6 Claims, 5 Drawing Figures

BURIED JUNCTION JOSEPHSON INTERFEROMETER

CROSS REFERENCE TO RELATED APPLICATION

This application claims priority under the International Convention for the Protection of Industrial Property, from European patent application Ser. No. 8,110,078.3, filed Dec. 2, 1981 in the European Patent Office.

The invention relates to superconducting logic circuits, and particularly concerns a buried junction Josephson interferometer comprising a base electrode common to the junctions and covered, at least in the junction areas, with a tunnel barrier layer on which counter-electrodes are deposited, these being connected via an interferometer bridge separated from the underlaying base electrode by an insulating layer.

DESCRIPTION OF THE PRIOR ART

Josephson interferometers are well known in the art. In the data processing field their application has been suggested particularly for memory cells but also for logic circuitry of a wide variety of layouts and functions. The publications listed below are representative of the current state of the art:

U.S. Pat. No. 3,936,809, Zappe, "Single Flux Quantum Storage Devices and Sensing Means Therefor," Feb. 3, 1976

Henkels, "Compact Bridge Josephson Interferometer," IBM Technical Disclosure Bulletin, Vol. 22, No. 7, December 79, pp. 2970-73.

Faris, "Coupling Element for Josephson Read-Only Memory," IBM Technical Disclosure Bulletin, Vol. 20, No. 10, March 78, pp. 4197-98.

Gheewala et al, "New Interferometer Structures," IBM Technical Disclosure Bulletin, Vol. 22, No. 5, October 79, pp. 2139-42.

Gueret et al, IEEE Transactions of Magnetics, Vol. MAG-13, No. 1, January 77, pp. 52-55, Article "Single Flux-Quantum Memory Cells." and Gheewala, IBM Journal of Research and Development, Vol. 24, No. 2, March 1980, pp. 131-142, Article "Design of 2,5 micrometer Josephson Current Injection Logic."

SUMMARY OF THE INVENTION

The interferometers disclosed in these publications comprise two, three or even more Josephson junctions capable of supporting Josephson tunnel currents. These interferometers employ planar Josephson junctions formed by depositing, onto a substrate, a first layer of a metallic film of superconducting material which serves as base electrode, by a subsequent oxidation whereby the tunnel barrier is produced, and by depositing a second superconducting metallic layer, the counter-electrode. Interferometers with junctions having a common base electrode and in which the counterelectrodes are connected via a bridge, separated from the common base electrode by an insulation layer, are referred to as bridge interferometers. Their gate or threshold characteristic provides for margins and operating windows that result in a good yield. One of the essential parameters determining this characteristic is the $LI_o$ product of the interferometer structure, L being the interferometer loop inductance, $I_o$ being the maximum Josephson junction current which is proportional to the maximum current density of the junctions and to the junction area.

Various measures have in the past been taken to improve, i.e., to increase the $LI_o$ product. L has been increased by either increasing the thickness of the insulation layers separating the bridge from the base electrode or by increasing the length of the device. The accomplished improvement with the first approach is limited by the planar technology used in that very thick layers provide problems when further layers have to be deposited on top of the thick layer. The second approach automatically leads to larger structures, i.e., to an undesired increase in the area required by the interferometer.

On the other hand, the maximum Josephson current $I_o$ can be increased by increasing the current density $j_{max}$. This is possible within certain limits but, above approx. 5 $KA/cm^2$, becomes critical because of its effect on the switching characteristics of the interferometer. This is of particular importance in applications in single flux quantum (SFQ) vortex memory cells where stored binary values "1" and "0", respectively, are represented by the presence or absence of a flux quantum captured in the interferometer. A high current density results in a higher "critical point" of the threshold characteristic of the interferometer, this being the point on the vortex threshold curves above which crossing of the curves causes switching into the voltage state whereas crossing the curves below the critical point results in a change in the vortex mode, i.e., either in the capture or release of a flux quantum. For memory applications, a low critical point is therefore an essential requirement for reliable switching operations and sufficiently large operating margins.

It is a main object of the present invention to provide an interferometer structure requiring a reduced area thereby permitting higher packaging densities. Another object is to present an interferometer structure permitting, without increasing the required area for the device, a layout resulting in a higher interferometer inductance thereby improving the switching characteristics of the interferometer. A further object is to provide an interferometer structure with improved characteristics that can be manufactured using well known and controllable process steps.

These objects are met by the interferometer herein described that is characterized in that the insulating layer extends between the counter-electrodes and the interferometer bridge such that the junctions are located underneath the interferometer bridge.

The disclosed interferometer structure provides for a higher inductance without increasing the device area and thus permits higher packaging densities than achievable with hitherto known interferometer structures. This is achieved without negatively effecting the essential characteristics of the basic interferometer such as switching speed and operating margins. It can, furthermore, be produced in a production process involving only steps that can be easily controlled.

BRIEF DESCRIPTION OF THE DRAWINGS

Several ways of carrying out the invention are described in detail below with reference to drawings which illustrate specific embodiments, and in which.

DESCRIPTION OF A PREFERRED EMBODIMENT

Figure 2:
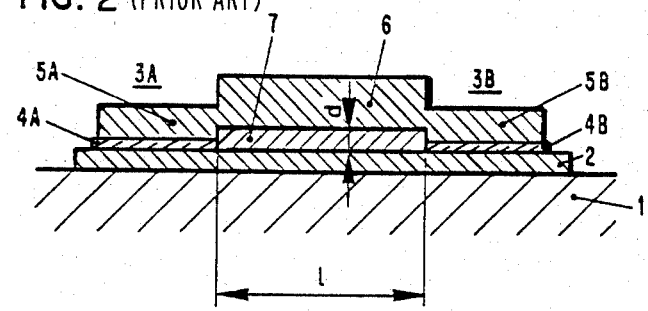
FIG. 2 is a schematic sectional view of a 2-Josephson-junction bridge interferometer in accordance with the present invention.

FIG. 2 represents a schematic view of a 2-junction interferometer representative of the state of the art in which, for reasons of simplicity, only the major functional elements such as electrodes and insulations are shown. Insulations encapsulating the device as well as control lines that may be arranged on top of the interferometer structure are omitted.

A substrate, possibly covered with an insulation layer, not shown, is designated 1. Deposited onto this substrate is a thin metal layer 2 of superconducting material forming the common base electrode for two Josephson junctions 3A and 3B. These are formed by the base electrode, oxide layers 4A and 4B, and by metallic superconducting counter electrodes 5A and 5B, respectively. Layers 4A and 4B, normally consisting of an oxide of the base electrode material, are capable of supporting Josephson tunnel currents therethrough and will be referred to as tunnel barrier layers. The two counterelectrodes are connected via a superconducting bridge 6 which is separated from the base electrode layer 2 by insulating layer 7. The interferometer inductance L is essentially determined by the thickness d and the length l (between the two electrodes) of layer 7. Performance requirements often define the minimum value of the $LI_o$ product of the interferometer. With a given $I_o$, determined by the maximum current density $j_{max}$ and by the junction dimensions, the area covered by the interferometer structure shown in FIG. 1 depends largely on the required value of the inductance L which is proportional to the length l. External connection to base electrode and counter-electrode may be made externally in conventional fashion.

Figure 1:
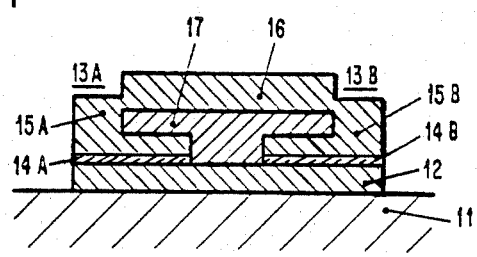
FIG. 1 is a schematic sectional view of a 2-Josephson-junction bridge interferometer representative of the state of the art.

FIG. 1 shows a schematic view of the interferometer of the present invention. The new structure permits a substantial reduction of the area required for the interferometer without effecting parameters L and $I_o$.

The common base electrode 12 is again arranged on a substrate 11. The two Josephson junctions 13A and 13B are formed by this base electrode 12, the two tunnel barrier layers 14A and 14B, and by counter-electrodes 15A and 15B. These are connected via bridge 16 which, in turn, is isolated from the base electrode 12 and from the top surfaces of electrodes 15A and 15B by means of insulation 17.

The basic concept on which this structure is based is to "bury" the Josephson junctions under the interferometer bridge. The counterelectrodes of the junctions become part of the inductance loop between the junctions. The inductance L of the interferometer of FIG. 1 is essentially determined by the length of the average thickness of the insulation layer 17. As can be seen from a comparison of the two structures shown in FIGS. 1 and 2, respectively, the inductances L are approx. the same for both interferometers. The same applies for the values $I_o$ if identical junctions are used. It follows that the $LI_o$ product is the same for both structures. Since the length of the structure of FIG. 1 and thus the required device area is reduced, the described inventive interferometer permits substantially higher packaging densities.

Figure 3:
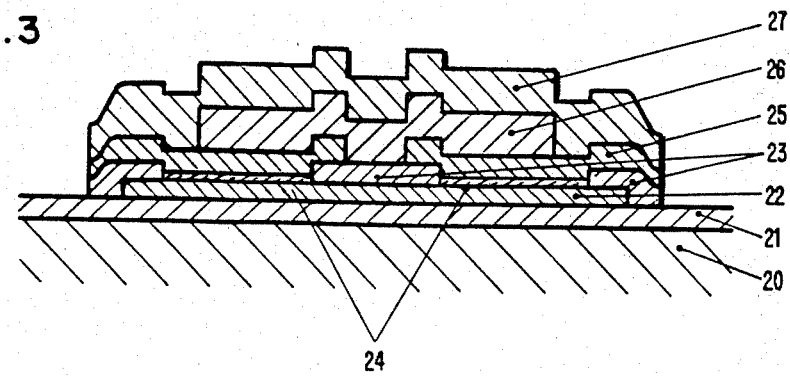
FIG. 3 is a sectional view of a 2-junction interferometer structure suitable for production processes involving optical lithography steps.

TABLE I lists the process steps required to produce the interferometer shown in FIG. 3 which is a typical embodiment of the present invention. It basically corresponds to the structure briefly described with the aid of FIG. 2. All processes used to evaporate, to etch, to clean, or to "pattern" are well known and can be performed by employing conventionally available equipment. They are, therefore, not explained in greater detail here.

Starting point is a planar substrate 20 which is covered with an insulating layer 21 (FIG. 3). In a first process step, a Nb layer 22 of 2500 Å thickness is evaporated onto insulation layer 21. Layer 22 forms the common base electrode of the interferometer. The desired pattern is obtained by applying well known photo-resist techniques and subsequent plasma etching. Insulations 23 are formed by evaporating a 500 Å SiO layer onto layer 22. It is patterned in a photoresist and subsequent lift-off process resulting in the two outer sections isolating the edges of the base electrode 22 and in the center section which serves to separate the later formed barrier layers 24. The three insulation sections 23 determine the junction areas of the two Josephson junctions of the interferometer. This step is followed by a conventional rf-cleaning operation performed in order properly to condition the surface of the base electrode 22 for the next or fourth step in which the tunnel barriers 24 are obtained in a rf-oxidation process during which a Nb oxide layer ($Nb_2O_5$) of 20 to 30 Å thickness is formed on the sections of the base electrode that are not covered by the insulation 23. In a fifth step, a 1000 Å layer 25 of Pb alloy, e.g. PbInAu, is evaporated, its pattern being determined by a photo-resist stencil. After a lift-off process, the resulting pattern leaves a window above the center section of insulation 23. Subsequently, SiO insulation layer 26 of 2000 Å thickness is deposited and shaped as shown in FIG. 3. Through the window in layer 25 it is directly connected to the center section of insulation 23. The non-covered surfaces of counter-electrodes 25 are subjected to a rf-cleaning operation to provide a clean surface and thus permits a good electrical contact with the Pb alloy layer 27 of 3000 Å thickness that is subsequently evaporated onto the whole structure. Layer 27 forms the interferometer bridge connecting the counter-electrodes 25 of the two junctions.

TABLE I

| Layer (Ref. No. in FIG. 3) | Material/ Thickness | Process Step |
| --- | --- | --- |
| 1. Base electrode (22) | Nb/2500 Å | Nb evaporation (Plasma etching) |
| 2. Insulation (23) | SiO/500 Å | SiO evaporation (Lift-off patterning) |
| 3. and | and | rf-cleaning |
| 4. Tunnel barrier (24) | Nb oxyd/20–30 Å | rf-oxidation |
| 5. Counter-electrode (25) | Pb alloy/1000 Å | Pb alloy evaporation (Lift-off patterning) |
| 6. Insulation (26) | SiO/2000 Å | SiO evaporation (Lift-off patterning) |
| 7. and | and | rf-cleaning |
| 8. Bridge (27) | Pb alloy/3000 Å | Pb alloy evaporation |

TABLE I-continued

| Layer (Ref. No. in FIG. 3) | Material/ Thickness | Process Step |
|---|---|---|
| | | (Lift-off patterning) |

Further conventional process steps not described in detail here are required to isolate, encapsule or shield the interferometer. Additional electrically conducting layers may also be required for applications in which control currents are used to effect the Josephson junctions. These layers, after proper patterning, will then function as control lines.

When applying, e.g., a 2,5 μm line width technology, the planar dimensions of the interferometer structure of FIG. 3 can be chosen as follows:

| | |
|---|---|
| length (in paper plane) | approx. 20 μm |
| depth (perpendicular to paper plane) | 12,5 μm |
| junction size | 6,25 × 12,5 μm |
| length of insulator 26 | 15 μm |

TABLE II lists the process steps required to produce the interferometer structure shown in FIG. 4 which, again, is a typical example of the present invention. This structure requires, for the lithography, precise alignment tools such as those employing e-beams or x-rays. These tools permit sufficiently accurate pattern definition, e.g., of the junction areas, thereby eliminating the need for the insulation layer 23 used in the structure of FIG. 3 to accurately define the junctions.

Figure 4:
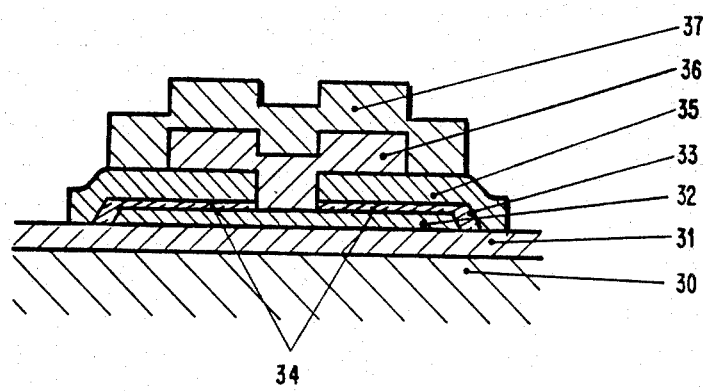
FIG. 4 is a sectional view of another 2-junction interferometer structure suitable for production processes involving optical and e-beam lithography steps.

Starting point is again a planar substrate 30 which is covered with an insulating layer 31 (FIG. 4). In a first process step a Nb layer 32 of 2500 Å thickness is evaporated onto insulation layer 31. Layer 32 forms the common base electrode of the interferometer. The desired pattern is obtained through photo-resist techniques and subsequent plasma etching. While the resist is still on the top of the base electrode layer, edges 33 are isolated in an rf- or plasma oxidation process. The thickness of this $Nb_2O_5$ oxidation is in the order of a few hundred Å, e.g., 400 Å. This step is followed by a conventional rf-cleaning operation. Then the tunnel barrier layers 34 are obtained in an rf-oxidation process during which the Nb oxide layer ($Nb_2O_5$) of 20 to 30 Å thickness is formed. In a fifth step, a 3000 Å layer 35 of Pb alloy, e.g., PbInAu, is evaporated. It forms the counter electrode. The desired pattern, i.e., the definition of the junction areas, is obtained by using an e-beam produced resist stencil and a lift-off operation to accurately control the distance between the two counter-electrodes. Subsequently, a SiO insulation layer 36 of 4000 Å thickness is evaporated. It is patterned to cover the base electrode section accessible through the window in layer 35 as well as the "inner" portions of the top surfaces of counter-electrodes 35. After a rf-cleaning operation, a 5000 Å Pb alloy (e.g. PbInAu) layer forming the interferometer bridge 37 is deposited. It covers insulation 36 and contacts the "outer" portions of the top surfaces of counter-electrodes 35. Bridge 37, counter-electrodes 35, and base electrode 32 form the inductance loop of the interferometer. External connections to base electrode 32 and counter-electrodes 35 (not shown) are made in conventional fashion.

TABLE II

| Layer (Ref. No. in FIG. 4) | Material/ Thickness | Process Step |
|---|---|---|
| 1. Base electrode (32) | Nb/2500 Å | Nb evaporation (Plasma etching) |
| 2. Edge insulation (33) | Nb oxide/400 Å | rf-oxidation (or chemical) |
| 3. | | rf-cleaning |
| 4. Tunnel barrier (34) | Nb oxide/20-30 Å | rf-oxidation |
| 5. Counter-electrode (35) | Pb alloy/3000 Å | Pb alloy evaporation (Lift-off patterning) |
| 6. Insulation (36) | SiO/4000 Å | SiO evaporation (Lift-off patterning) |
| 7. | | rf-cleaning |
| 8. Bridge (37) | Pb alloy/5000 Å | Pb alloy evaporation (Lift-off patterning) |

As already noted in connection with table I and FIG. 3, further process steps are required to complete the structure but these are not explained in detail since they do pertain to features that are common to both the present interferometer and to known structures.

When applying, e.g. a 2.5 μm line width technology, the planar dimensions of the interferometer of FIG. 4 can be chosen to be

| | |
|---|---|
| length (in paper plane) | approx. 15 μm |
| depth (perpendicular to paper plane) | 10 μm |
| junction size | 10 × 6.25 μm |
| length of insulator 36 | 10 μm |

In Table III the interferometer area reduction that can be achieved with the present invention is illustrated. The figures apply for a 2.5 μm min. line width technology with a lithographic square of 2.5×2.5 μm.

The area requirements of known interferometer designs (as shown in FIG. 1) with different insulation layer thicknesses (2000 Å and 4000 Å, respectively) are compared with the area requirements of the structures shown and described herein (FIGS. 3 and 4, respectively). Since the four interferometers compared have the same $LI_o$ product and essentially the same performance characteristics, the area reduction that can be achieved amounts to a substantial advantage.

TABLE III

| Structure | Thickness of Insulation (4,26,36) | Interferometer Lithogr. Squares | Area μm² |
|---|---|---|---|
| FIG. 1 (prior art) | 2000 Å | 77 | 480 |
| FIG. 1 (prior art) | 4000 Å | 54 | 340 |
| FIG. 3 | 2000 Å | 52 | 325 |
| FIG. 4 | 4000 Å | 34 | 210 |

Figure 5:
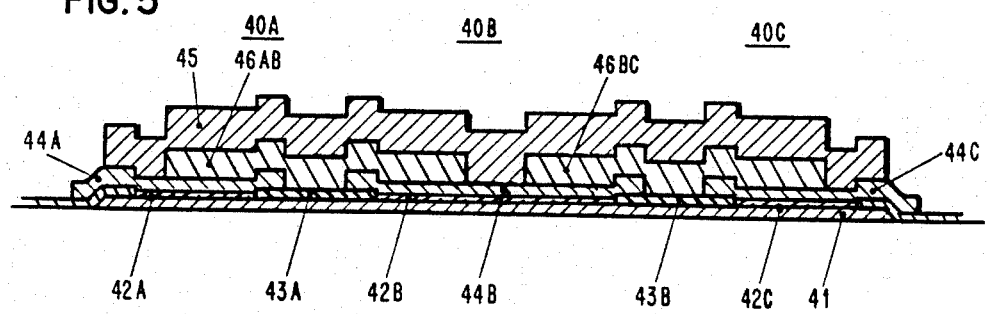
FIG. 5 is a sectional view of a 3-junction interferometer in accordance with the present invention.

FIG. 5 is a schematic view of an asymmetric 3-junction interferometer employing the inventive concept. In the structure shown the center junction (40B) area is twice as large as that of the two outer junctions (40A, 40C).

For simplicity reasons the isolated substrate is omitted. The base electrode, common to all three junctions, is designated 41. The three barrier layers 42A, 42B, and 42C are separated from each other and defined by insulation layers 43A and 43B. Counter-electrodes 44A, 44B and 44C connect via bridge 45. Insulations 46AB and 46BC determine, together with the bridge and the respective counter-electrodes and base electrode sections, the inductances of the two interferometer loops. Again, the inventive concept is employed: The Josephson junctions are placed under the interferometer bridge whereby the counter-electrodes of the junctions become part of the inductance loop between the junctions.

Like any other of the earlier cited prior art interferometers, the device described hereinabove is well suited for a wide variety of applications. It can, e.g., be used as basic switching element employed in logic circuitry such as that disclosed in an article by H. Beha "Asymmetric 2-Josephson-Junction Interferometer as a Logic Gate" (Electronics Letters, Mar. 31, 77, Vol. 13, No. 7, pp. 218-220). A 3-junction interferometer for applications in logic circuitry has been disclosed in a paper by H. Beha and H. Jäckel "High Tolerance 3-Josephson Junction Current-Injection Logic Devices" (Digest of IEEE Intermag Conference 1981, Grenoble, May 12-15, 81, page 40-4).

Another application for which the present interferometer structure is particularly well suited in the use in memories where it can form the basic storage element. An example of such a Josephson memory cell has been disclosed in an article by H. Beha "Two-Josephson-Junction Interferometer Memory Cell for N.D.R.O." (Electronics Letter, Sept. 29, 77, Vol. 13, No. 20, pp. 596-598).

It is noted that the inventive concept has been described using a few embodiments as examples but that the same design principles are also applicable to interferometers with, e.g., more than three junctions, or with complex current feeding systems. Also, it is suitable for different control schemes: control currents may be magnetically coupled to the interferometer or directly injected. The interferometer may be symmetric or asymmetric. Obviously, different materials, dimensions or production processes may be used in making the interferometer without departing from the inventive concept.

We claim:

1. A buried junction Josephson interferometer comprising a base electrode, covered in junction areas with a plurality of tunnel barrier layers forming Josephson junctions, a plurality of counter-electrodes deposited over said tunnel barrier layers, an interferometer bridge connecting said counter-electrodes, separated from said base electrode by insulating layers, characterized in that said insulation layers, said counter-electrodes and said interferometer bridge are juxtaposed with said Josephson junctions and said counter-electrodes are located substantially underneath said interferometer bridge but substantially isolated by said insulation layer.

2. An interferometer as claimed in claim 1, characterized in that said bridge, the top surfaces of said counter-electrodes and the section of said base electrode not covered by the counter-electrodes form a loop that determines the interferometer inductance.

3. An interferometer as claimed in claim 1, further characterized by an edge insulation layer, covering the edges of said base electrode in the vicinity of said base electrode, isolating said base electrode from said counter-electrodes.

4. An interferometer as claimed in claim 1, characterized in that said plurality of Josephson junctions comprises three junctions.

5. An interferometer as claimed in claim 4, characterized in that it comprises two inductance loops each formed by the top surfaces of the counter-electrodes of two of said Josephson junctions and by respective sections of said bridge and said base electrode.

6. The interferometer as claimed in claim 4, characterized in that the interferometer is asymmetric in that the center junction is twice as large than the outer junctions.

* * * * *